(12) United States Patent
Van Aken

(10) Patent No.: US 9,448,884 B2
(45) Date of Patent: *Sep. 20, 2016

(54) APPARATUSES AND METHODS FOR ENCODING USING ERROR PROTECTION CODES

(71) Applicant: MICRON TECHNOLOGY, INC., Boise, ID (US)

(72) Inventor: Stephen P. Van Aken, Boulder, CO (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/336,873

(22) Filed: Jul. 21, 2014

(65) Prior Publication Data

US 2014/0365846 A1   Dec. 11, 2014

Related U.S. Application Data

(63) Continuation of application No. 13/412,539, filed on Mar. 5, 2012, now Pat. No. 8,788,915.

(51) Int. Cl.
*H03M 13/00* (2006.01)
*G06F 11/10* (2006.01)
*H03M 13/15* (2006.01)
*H04L 1/00* (2006.01)

(52) U.S. Cl.
CPC .......... *G06F 11/1076* (2013.01); *H03M 13/15* (2013.01); *H03M 13/152* (2013.01); *H03M 13/1515* (2013.01); *H03M 13/1595* (2013.01); *H03M 13/151* (2013.01); *H03M 13/159* (2013.01); *H04L 1/0057* (2013.01)

(58) Field of Classification Search
CPC .......... H03M 13/151; H03M 13/091; H03M 13/15; H03M 13/09; H03M 13/27; H03M 13/29; H04L 1/0057; H04L 1/0041; G11B 20/1833; G06F 11/1068
USPC ........ 714/752, 781, 782, 784, 759, 800, 801
See application file for complete search history.

(56) References Cited

U.S. PATENT DOCUMENTS

| | | | |
|---|---|---|---|
| 4,555,784 A * | 11/1985 | Wood | H03M 13/15 714/784 |
| 5,483,236 A | 1/1996 | Bi | |
| 5,642,366 A * | 6/1997 | Lee | H03M 13/151 714/758 |
| 5,712,861 A * | 1/1998 | Inoue | H03M 13/151 714/752 |
| 6,154,868 A | 11/2000 | Cox et al. | |
| 6,295,011 B1 | 9/2001 | Brown | |
| 6,404,831 B1 * | 6/2002 | Melas | G11B 20/10009 360/51 |

(Continued)

OTHER PUBLICATIONS

USPTO; Office Action dated Jan. 3, 2014, from related U.S. Appl. No. 13/412,539, filed Mar. 5, 2012.

*Primary Examiner* — Albert Decady
*Assistant Examiner* — Osman M Alshack
(74) *Attorney, Agent, or Firm* — Brooks, Cameron & Huebsch, PLLC

(57) ABSTRACT

Subject matter disclosed herein relates to error protection of data stored in and/or read from a memory device. Coefficient data representing canonical coefficients can be pre-computed by an apparatus before the apparatus is provided with program data, for example. For example, coefficient data may be pre-computed external to the apparatus and stored before program data is provided to an apparatus.

20 Claims, 6 Drawing Sheets

(56) References Cited

U.S. PATENT DOCUMENTS

| | | | |
|---|---|---|---|
| 6,493,845 B1* | 12/2002 | Shen | H03M 13/158 714/784 |
| 6,807,649 B1* | 10/2004 | Murthy | G06F 11/1076 714/764 |
| 7,003,715 B1 | 2/2006 | Thurston | |
| 7,809,994 B2 | 10/2010 | Gorobets | |
| 8,458,564 B2 | 6/2013 | Murray et al. | |
| 8,788,915 B2* | 7/2014 | Van Aken | H03M 13/15 714/752 |
| 2002/0133783 A1* | 9/2002 | Oldfield | G06F 11/1076 714/800 |
| 2003/0023809 A1* | 1/2003 | Oldfield | G06F 11/1076 711/114 |
| 2004/0078643 A1* | 4/2004 | Ghosh | G06F 11/1076 714/6.2 |
| 2005/0004920 A1* | 1/2005 | Omori | G06F 19/28 |
| 2005/0154964 A1 | 7/2005 | Vityaev | |
| 2006/0041824 A1* | 2/2006 | Shieh | H03M 13/15 714/781 |
| 2009/0110109 A1 | 4/2009 | Skerlj | |
| 2010/0100797 A1 | 4/2010 | Chen | |
| 2010/0135375 A1 | 6/2010 | Lee et al. | |
| 2010/0241923 A1 | 9/2010 | Wang et al. | |
| 2010/0332942 A1 | 12/2010 | Wezelenburg et al. | |
| 2012/0011420 A1 | 1/2012 | Kim et al. | |
| 2012/0274513 A1 | 11/2012 | Le Bars et al. | |
| 2013/0073925 A1 | 3/2013 | Mizushima | |

* cited by examiner

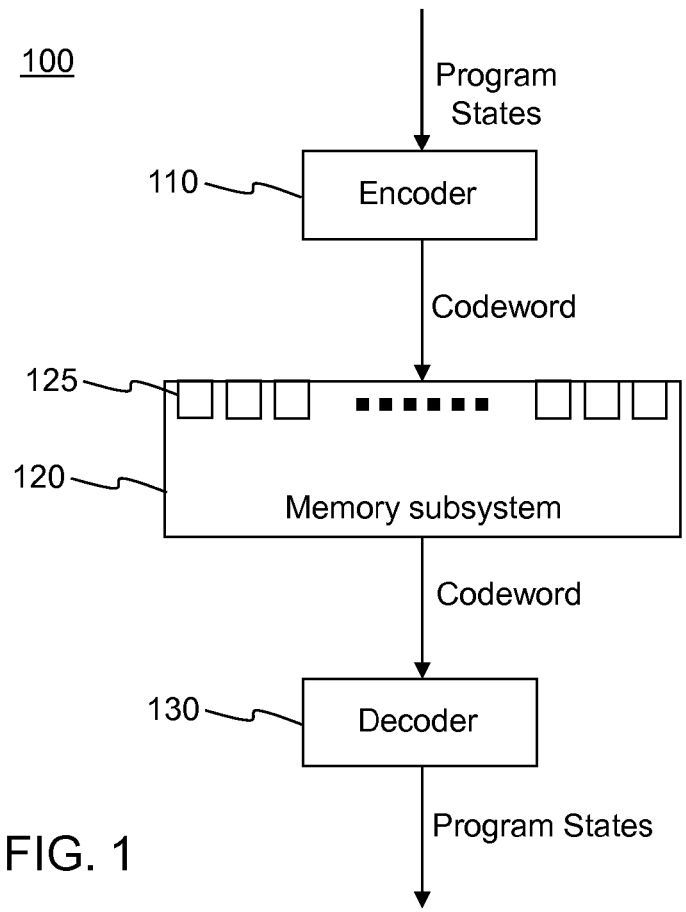
FIG. 1
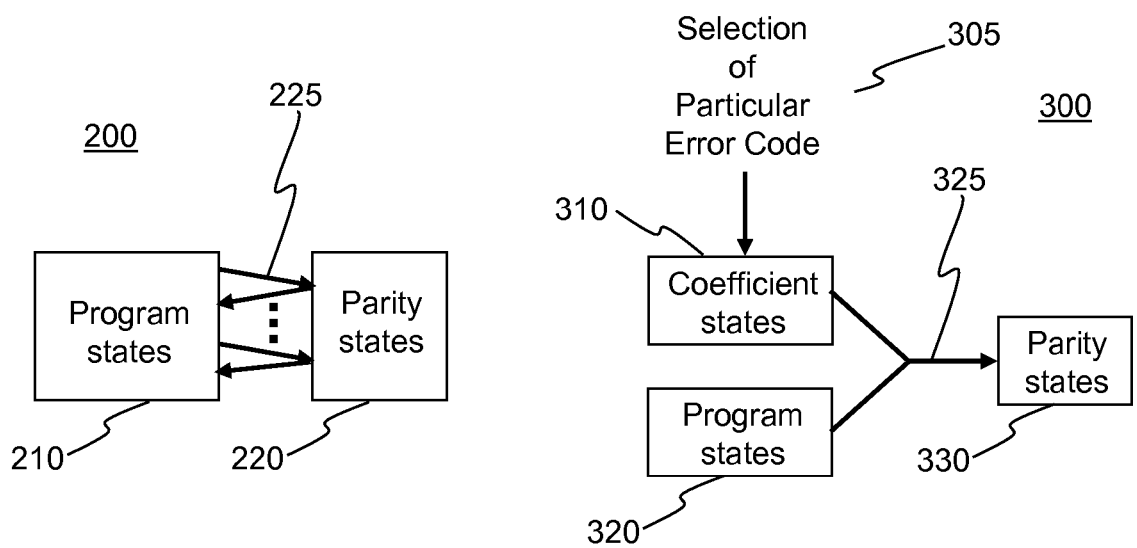
FIG. 2
FIG. 3

APPARATUSES AND METHODS FOR ENCODING USING ERROR PROTECTION CODES

CROSS-REFERENCE TO RELATED APPLICATION

This application is a continuation application of U.S. application Ser. No. 13/412,539, filed Mar. 5, 2012, now U.S. Pat. No. 8,788,915, the entirety of which is incorporated by reference herein.

BACKGROUND

1. Field

Subject matter disclosed herein relates to error protection of data stored in and/or read from a memory device.

2. Information

Memory devices, which can include an array or arrays of memory cells, continue to become denser to provide increased storage capacity. However, as their memory cells become smaller, they may also tend to become more prone to errors. Errors occurring during reading and/or writing of a nonvolatile memory may result from storage charge loss, random telegraph signal effects, coupling effects, de-trapping mechanisms, read disturb phenomena, and/or cosmic rays, just to name a few examples. Such may occur for a number of nonvolatile memory technologies like NAND Flash Memories, NOR Flash Memories, and/or Phase Change Memory. In addition, error probability may increase for memories utilizing multi-level architecture to store data (e.g., code, instructions, or any other information) in a memory cell. Here, a voltage (and/or current) window may remain largely the same but a read and/or write margin may decrease because signal levels may be relatively close together, for example. Techniques to address potential memory errors remain desirable.

BRIEF DESCRIPTION OF THE FIGURES

Embodiments of claimed subject matter are illustrated by way of example and not by way of limitation in the figures of the accompanying drawings, in which:

FIG. 1 is a schematic diagram of an embodiment of an arrangement of memory devices;

FIG. 2 is a schematic diagram of an embodiment for iteratively generating parity data from program data;

FIG. 3 is a schematic diagram of an embodiment for computing parity data from program data and coefficient data;

DETAILED DESCRIPTION

Figure 4:
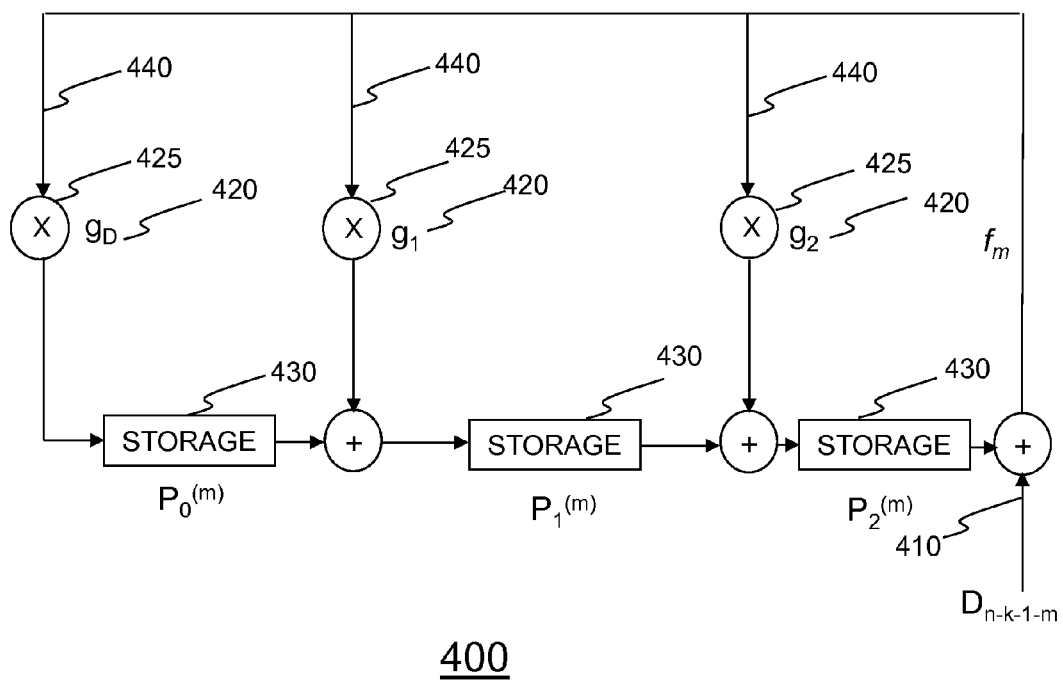
FIGS. 4-6 are schematic diagrams of embodiments of parity generation circuits.

In the following detailed description, reference is made to the accompanying figures that show, by way of illustration, specific embodiments of claimed subject matter. These embodiments are described in sufficient detail to enable those skilled in the art to practice claimed subject matter. It is to be understood that the various embodiments of claimed subject matter, although different, are not necessarily mutually exclusive. For example, a particular feature, structure, and/or characteristic described herein in connection with one embodiment may be implemented within other embodiments of claimed subject matter. In addition, it is to be understood that the location and/or arrangement of individual components within a disclosed embodiment may be modified. The following detailed description is, therefore, not to be taken in a limiting sense, and subject matter for the present application is determined by the issued claims, appropriately interpreted, along with the full range of equivalents to which the claims are entitled. In the drawings, like numerals refer to the same and/or similar aspects throughout the several views.

Some portions of the following description are presented in terms of logic, algorithms, and/or symbolic representations of operations on data stored within an apparatus, such as a memory (e.g., stored bits, such as stored logical signal values), whether alone or as part of a system, such as a special-purpose computing device and/or platform. In the context of the specification, the term "specific system" and/or the like includes a general-purpose computing device once it is programmed to perform particular functions pursuant to instructions from program software. Algorithmic descriptions and/or symbolic representations are examples of techniques used by those of ordinary skill in the art in the data processing and/or related arts to convey the substance of their work to others skilled in the art. An algorithm is here, and generally, considered to be a self-consistent sequence of operations and/or similar processing leading to a desired result. In this context, operations and/or processing involve manipulation of physical properties. Manipulation includes a change in a physical property of a memory cell such that the memory cell is to be programmed to a particular data state (e.g., a state representing a logic "1" and/or a state representing a logic "0"). Manipulation also includes a change in a physical property of a data signal (e.g., an acoustic, electrical, magnetic, and/or optical signal) used to combine, communicate, compare, store, transform and/or otherwise manipulate data to be programmed into and/or read from one or more memory cells. It has proven convenient at times, principally for reasons of common usage, to refer to data signals and/or data states as data (e.g., bits, values, elements, symbols, characters, terms, numbers, numerals, and/or the like). It should be understood, however, that all of these and/or similar terms are to be associated with the appropriate physical properties, and/or corresponding measurements thereof and, therefore, are merely convenient labels.

Unless stated otherwise, as apparent from the following discussion, it is appreciated that throughout the specification, discussions utilizing terms such as "processing," "computing," "determining," "detecting," "flagging," "designating," "setting," "assigning," "generating," "storing", and/or the like may refer to actions and/or processes of an apparatus (e.g., a memory device or other specific apparatus, such as a special purpose computer and/or similar special-purpose computing device). In the context of this specification, therefore, a special-purpose computer and/or a similar special-purpose computing device is capable of, for example, manipulating data, such as that in the form of data signals and/or data states.

Embodiments of claimed subject matter may include methods and/or apparatuses (e.g., an individual apparatus or a combination of apparatuses or components thereof) for performing operations. An apparatus may be specially constructed for desired purposes and/or an apparatus may comprise a general-purpose computing device capable of operating in accordance with a computer program stored in memory. A program may be stored in memory, such as, but not limited to, any type of disk including floppy disks, optical disks, compact disc read only memories (CD-ROMs), magnetic-optical disks, read-only memories (ROMs), random access memories (RAMs), nonvolatile memories such as electrically programmable read-only memories (EPROMs), electrically erasable and programmable read only memories (EEPROMs) and/or FLASH memories, phase change memories (PCM) and/or any other type of media suitable for storing electronic instructions.

A memory typically may be non-transitory and/or comprise a non-transitory device. In this context, a non-transitory memory may include a device that is tangible, meaning that the device has a concrete physical form, although the device may change its physical state. Thus, for example, non-transitory refers to a device remaining tangible despite this change in state.

In describing embodiments of claimed subject matter, the term "bit" corresponds to a binary digit of data, such as represented by a state of a binary digital data signal, which is sometimes also referred to as a logic signal, a binary signal, a logic state, or a binary state. The value of a bit, a fraction of a bit, or multiple bits may be stored by programming a memory cell, such as a single transistor, for example, to one of a plurality of data states. For example, in a single level memory cell, the cell might be programmed to a first (e.g., logic 1) data state or a second (e.g., logic 0) data state. Additionally, multiple binary digital data signals and/or multiple data states comprising individual binary digital data signals and/or data states may be organized and/or aggregated to construct (e.g., assemble) a "symbol," which may collectively represent, for example, two bits, four bits, eight bits, 10 bits, and so forth. In one example, a 2-bit symbol may have a value of 00, 01, 10, or 11. In some cases, a single memory cell may be selectively programmed to a respective data state representing any one of those values. For example, a 00 value for a 2-bit symbol may be stored by programming a memory cell to a respective one of four possible data states (e.g., corresponding to a respective range of threshold voltage levels). In a similar manner, a particular value of a 4-bit symbol (e.g., 0101) may be stored by programming one or more memory cells to a respective one of 16 possible data states, and a particular value of an 8-bit symbol (e.g., 0000 0110) may be stored by programming one or more memory cells to a respective one of 256 different data states, and so forth. Any of the foregoing symbols may be communicated as one or more measurable physical properties (e.g., an acoustic, current, radiation, and/or voltage level) of, for example, one or more data signals.

Further, a "codeword" may be stored as respective programmed data states of multiple memory cells (perhaps as many as 200 or more) representing program data (e.g., stored information or information to be stored), along with, for example, respective programmed data states of multiple memory cell states representing parity data, which may be used to detect and/or correct errors in the program data that may have potentially been introduced through various mechanisms. Embodiments of claimed subject matter may include an erasure flag that indicates that location(s) of one or more errors within a codeword are known and/or may be approximated. In the event that location(s) of one or more errors within a codeword are known or may be approximated, certain error protection codes (such as, for example, a Reed Solomon error protection code) may be capable of correcting perhaps as many as twice the number of errors that could be corrected if the location(s) of the one or more errors was or were otherwise unknown (although nothing herein should be interpreted as requiring or limiting embodiments of claimed subject matter to a particular coding technique). In this context, an error protection code refers to a code employed to detect and/or correct errors (ECC).

Memory may be employed in a variety of contexts. As an example, memory may be included in a computing system. In this context, the term computing system refers to at least a processor and memory coupled by a bus. Likewise, in this application, the terms memory, memory system, memory module, memory device and/or memory apparatus are used interchangeably unless the context of usage indicates otherwise. A memory cell, however, refers to a unit of storage within a memory and a memory array refers to an array of memory cells. It is understood that a memory, memory system, memory module, memory device and/or memory apparatus may also include other circuitry or components to enable use of the memory cells of the array, for example. Likewise, a memory subsystem refers to a sub-portion of a memory system. Although in FIG. 1, an encoder and/or decoder are illustrated as separate from a memory subsystem, FIG. 1 is merely provided for purposes of illustration. Therefore, in other embodiments or implementations, a memory subsystem, for example, may include an encoder and/or a decoder. Use of various types of memory, such as phase change memory and/or NAND flash, for example, may benefit by including an error protection capability. Error protection may allow retrieval of program data at acceptably low rates of errors in data read from memory by employing ECC techniques. ECC techniques may include a relatively broad class of codes, such as BCH codes (Bose, Chaudhuri, Hocquenghem), which may include Reed-Solomon and/or narrow-sense BCH subsets, for example.

FIG. 1 is a schematic diagram of an embodiment 100 of an apparatus in the form of an arrangement of memory devices, which may include an error protection capability. For example, embodiment 100 may comprise an arrangement of component memory devices (e.g., memory chips or dice) as arrays of devices that may be written (e.g., programmed) to and/or read from during memory operations. In this application, the terms written to and programmed may be used interchangeably unless the context of usage indicates otherwise. Likewise, programmed refers to storing any type of data, not merely storing code, for example. Memory operations, such as reading from memory cells and/or writing to memory cells, may take place concurrently, sequentially and/or in various combinations. In one implementation of embodiment 100, program data may be stored in (e.g., written into) memory subsystem 120. Memory subsystem 120 may comprise any number of memory devices 125. Program data, which may comprise multiple bits (e.g., 1's and/or 0's) of data, may have been generated by a processor executing an application, for example, and may be transmitted as signals from the processor to the memory device(s). An encoder, such as 110 may add error protection to program data being written to memory subsystem 120. For example, encoder 120 may produce one or more codewords to be provided to memory subsystem 120, such as during memory operations. Memory subsystem 120 may store one or more codewords to be read at a later time. In one example implementation, a codeword may comprise program data and parity data computed (e.g., generated) by a particular ECC implementation. However, a codeword read from memory devices 125, may be subject to imperfections such as those resulting in erroneous data values being read. A decoder 130 may identify and/or remove in accordance with the intended operation of the particular error protection scheme erroneous data from a codeword with errors and return originally written program data.

It may be desirable for an encoder (e.g., encoder 110) and/or a decoder (e.g., decoder 130) of an apparatus, such as that of embodiment 100, for example, to operate relatively fast using a relatively low level of logic complexity. For example, it may be difficult to design an encoder, such as a Reed-Solomon and/or narrow-sense BCH encoder, that achieves relatively high-speed throughput, low latency, and/or relatively low logic-circuit complexity. In one application, an apparatus may comprise a component of a memory hierarchy using non-volatile storage that operates as an adjunct or replacement for traditional dynamic random access memory (DRAM). In this or other applications, desirable memory performance may involve throughputs with magnitudes on the order of up to gigabytes per second and/or latencies with magnitudes on the order of tens of nanoseconds, for example. However, some embodiments may achieve this level of performance using an encoder, such as encoder 110, for example, capable of operating based, at least in part, on electronics comprising circuitry, such as combinational logic-function circuitry, for example.

In an embodiment, parity data may be computed based, at least in part, on program data and on coefficient data for an employed error protection code. Coefficient data may represent values referred to as "canonical coefficients." In an embodiment, for example, coefficient data may be computed for an error protection code using a canonical form independent of program data, the computed coefficient data representing coefficients, such as canonical coefficients, employed to compute parity data from the program data. In this context, the term canonical form refers to a technique for representing coefficients employed to compute parity data from program data in which the coefficients are determined independent of the program data. In contrast, as described in more detail below, these coefficients are conventionally determined in a manner that is not independent of the program data.

In an implementation, coefficient data, e.g., representing canonical coefficients, as suggested above, may be computed for a particular type of error protection code independently of program data. Therefore, in an implementation, selection of a particular error code may, in effect, be applied to determine the coefficients. This feature may, therefore, in an implementation, allow for coefficient data representing canonical coefficients to be pre-computed by an apparatus before the apparatus is provided with program data, for example. For example, coefficient data may be pre-computed external to the apparatus and stored before program data is provided to an apparatus (e.g., a system or memory device).

Using coefficient data representing canonical coefficients to compute parity data may provide beneficial features for a particular implementation. For example, for a given type of error protection code, such computed coefficient data may be used (e.g., re-used) for different sets of program data stored in different memory arrays of a single memory device and/or different memory arrays of separate memory devices. For example, coefficient data may be stored in a look-up table of a memory device to be used to compute parity data for different sets of program data. Furthermore, using canonical coefficients permits computing parity data without necessarily using iterative calculations. Conventionally, an iterative process is employed to compute parity data. Computing parity data without iterative calculations suggests that calculations may be performed using combinational logic circuitry having relatively small size, low latency and/or low power compared with circuits to perform iterative calculations in an implementation, for example. In one embodiment, a size of combinational logic circuitry may be capable of being approximately linearly scaled with a number of parity bits that the combinational logic circuitry is to compute, for example.

Figure 5:
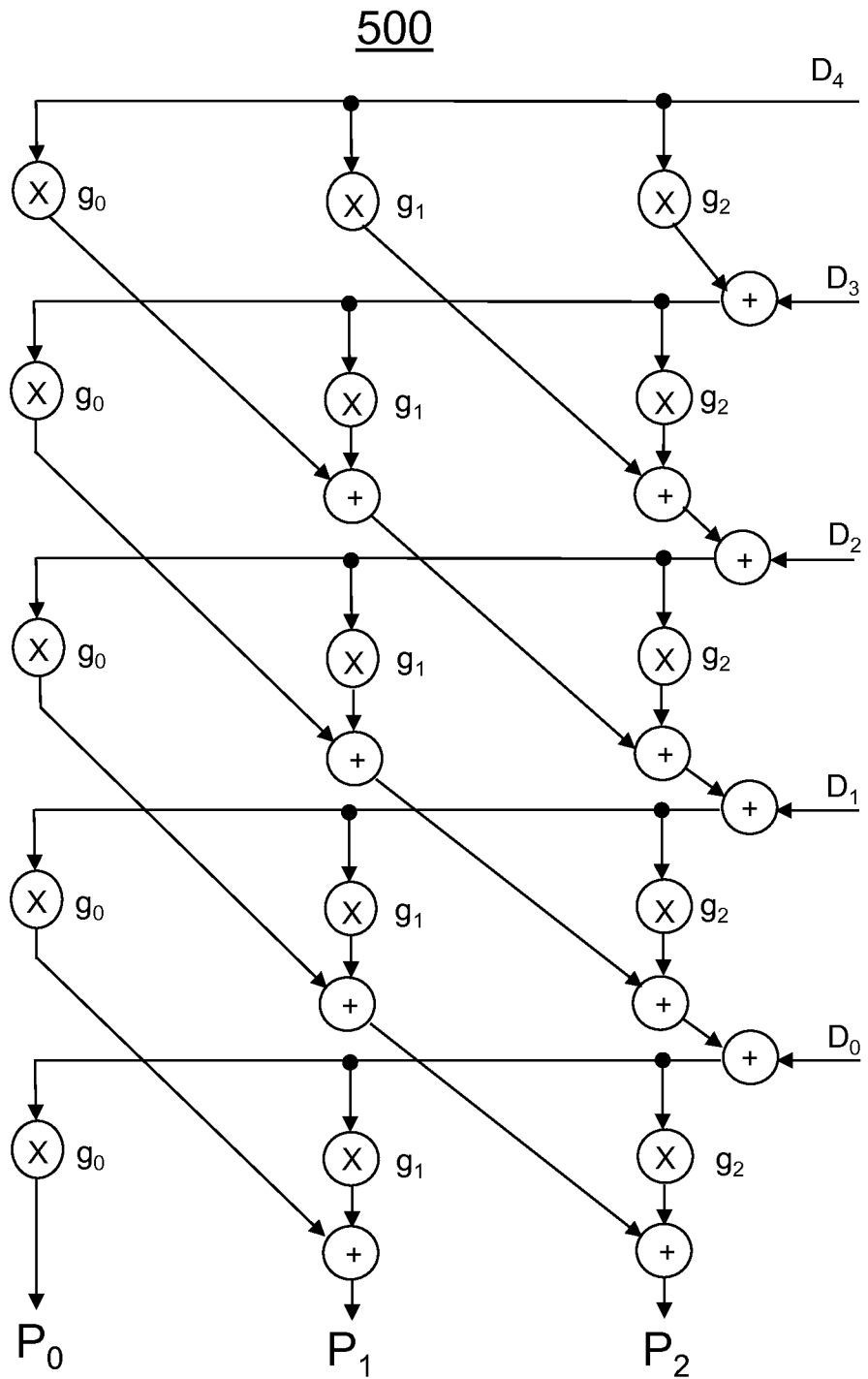

FIG. 2 is a schematic diagram of an embodiment 200 for iteratively generating parity data from program data. Embodiment 200 may comprise a circuit to generate parity data, an example of which is shown in FIGS. 4 and 5, described below. FIG. 3 is a schematic diagram of an embodiment 300 for computing (e.g., generating) parity data from program data and coefficient data. For example, coefficient data may represent canonical coefficients in a particular embodiment.

In embodiment 200, program data 210 may be used in an iterative process 225 to compute parity data 220. For new program data, iterative process 225 is re-employed, consuming computational resources and adding latency. Also, the size of circuitry to perform a computation may increase more than linearly with the number of bits of program data, for example.

In contrast, referring to embodiment 300, process 325 may compute parity data 330 based, at least in part, on coefficient data 310 and program data 320. Coefficient data may represent canonical coefficients, which may be pre-computed if an error protection code has been identified, such as by an application, an external device or a user, for example. Embodiment 300 may comprise combinational logic components, for example, to execute process 325 of computing parity data 330. As mentioned above, coefficient data representing canonical coefficients, for example, may be used (e.g., re-used) for multiple sets of program data to compute parity data.

In accordance with claimed subject matter, an error protection technique may involve computing coefficient data (e.g., in the form of bits of data) representing coefficients, such as canonical coefficients, for a combinatorial encoder for a block oriented error protection code. A block oriented code in this context, refers to a code to transform a sequence, such as a message, which comprises program data, into a(nother) fixed-length sequence, comprising a codeword. As previously suggested, error protection may be added by transforming the message into a larger codeword to detect and/or correct errors, which with suitable decoding, may be employed to recover the initial message.

In an embodiment, an error protection technique may be performed by a circuit that computes parity data based, in part, on program data and on pre-computed coefficient data representing coefficients of an error protection code, such as canonical coefficients. In one implementation, coefficient data may be pre-computed by an iterative process. For example, "pre-computed" may refer to a time prior to presentation (e.g., in a memory system) of program data for which parity data is computed. In one implementation, the coefficient data may be computed (e.g., generated) at a source, such as a processor, for example, external to a memory device. In another implementation, an apparatus may allow a selection of error protection code, where the coefficient data may be computed responsive to the selection. For example, an application, an external device or a user, as examples, may select an error protection code. Therefore, some embodiments may comprise an apparatus capable of computing coefficient data, such as based in part on code selection.

In an embodiment, an error protection technique may be performed by parity computing circuit blocks to compute associated parity data for corresponding groups of program data. For example, circuit blocks may apply pre-computed canonical coefficients to one or more groups of program data. Pre-computed canonical coefficients may comprise coefficients computed at a time prior to presentation (e.g., in a memory system) of program data for which parity data is computed. Pre-computed canonical coefficients may therefore be independent of the groups of program data. Parity computing circuit blocks may, for example, operate in parallel. Of course, these are merely examples, and claimed subject matter is not so limited.

In an embodiment, relation 1 may be employed in parity encoding for a cyclic algebraic code. Of course, this is merely one approach. This approach, not to be considered limiting, however, may be useful for illustrative purposes. Relation 1 may be used for any bit size of program data and/or parity data, for example. Relation 1 may be valid for Reed-Solomon implementations as well as narrow-sense BCH, for example.

$$\sum_{i=0}^{n-k-1} P_i x^i = \mod\left[\frac{x^{n-k} \times \sum_{i=0}^{k-1} D_i x^i}{\sum_{i=0}^{n-k} g_i x^i}\right] \quad [1]$$

In relation 1, parity data of the form $P_{n-k-1}, P_{n-k-2}, \ldots P_0$ may be generated from a remainder polynomial $P(x)$ resulting from a division of a program polynomial $D(x)=D_{k-1}, D_{k-2}, \ldots, D_0$ by a generator polynomial $g(x)=x^{n-k}+g_{k-1}x^{n-k-1}+\ldots+g_0x^0$, where $D_{k-1}, D_{k-2}, \ldots, D_0$ may comprise program data. If $g(x)$ comprises a generator polynomial for a Reed Solomon code, for example, it has roots $\alpha^{m0+0}, \alpha^{m0+1}, \ldots, \alpha^{m0+k-1}$ from some finite Galois field $GF(2^q)$, where m0 may comprise 0 and q may comprise size measured in bits. Here, n may comprise a number of bits of program and parity data and k may comprise a number of bits of parity data, both being positive integers.

The following example, which is not to be considered limiting, illustrates an n, k block code with n=8 and k=5. Relation 2 may illustrate an aspect of an encoding operation, for the example.

$$P_2x^2 + P_1x^1 + P_0x^0 = \text{Rem}\frac{x^3 \times [D_4x^4 + D_3x^3 + D_2x^2 + D_1x^1 + D_0]}{x^3 + g_2x^2 + g_1x^1 + gx^0} \quad [2]$$

In relation 2, program polynomial $D_4x^4, D_3x^3, \ldots, D_0x^0$ may be divided by a generator polynomial $x^3g_2x^2+g_1x^1+gx^0$ after scaling by $x^{n-k}$, where n−k=3, for this example. A parity polynomial, $P_2x^2+P_1x^1+P_0x^0$, may comprise a remainder. In an embodiment, encoding may include combining polynomials, as illustrated by relation 3.

$$D_4x^7+D_3x^6+D_2x^5+D_1x^4+D_0x^3+P_2x^2+P_1x^1+P_0x^0 \quad [3]$$

$D_i$ may represent data written to a memory system, such as that of embodiment 100, for example. Likewise, a read operation may retrieve the stored data, but many include distortions as a result physical processes encountered as a consequence of writing and/or reading. Relation 4, however, may enable decoding so that stored data may be identified and/or recovered correctly despite the presence of an error, for example. In relation 4, coefficients of the polynomial, $R_7$, $R_6, \ldots, R_0$, may comprise the values of data read from memory.

$$R_7x^7+R_6x^6+R_5x^5+R_4x^4+R_3x^3+R_2x^2+R_1x^1+R_0x^0 \quad [4]$$

In an implementation, a decoding process may also include a calculation of syndromes. Relation 5 may illustrate a syndrome calculation, for example, for Reed-Solomon implementations.

$$S_j=R_7(\alpha^j)^7+R_6(\alpha^j)^6+R_5(\alpha^j)^5+R_4(\alpha^j)^4+R_3(\alpha^j)^3+R_2(\alpha^j)^2+R_1(\alpha^j)^1+R_0(\alpha^j)^0 \quad [5]$$

For example, a substitution for x using a generator root $\alpha^j$, as shown, may be employed to do the calculation. Of course, these details are merely illustrative examples, and claimed subject matter is not so limited.

FIG. 4 illustrates an embodiment 400 of a circuit architecture that may be employed to calculate parity data from program data. For example, a linear feedback shift register may apply program data, such as $D_4, D_3, \ldots, D_0$, at 410. To obtain parity data $P_2, P_1, P_0$, from five bits of program data, for example, may involve five iterations, in which a respective bit of the program data is entered on an iteration, for example. Storage elements 430, as a result of circuit architecture, contain $P_2, P_1, P_0$ after the five iterations have occurred. Embodiment 400 may be less desirable for some situations since the iterations may constrain throughput and/or latency, for example.

FIG. 5 illustrates an embodiment 500 of a circuit architecture that may be employed to calculate parity data from program data without performing iterations. Instead, successive calculations may be cascaded through levels of combinational logic circuitry in an embodiment. However, circuit architecture, such as embodiment 500, may be relatively large as a result. Complexity may rise disproportionally with number of bits of data to be processed. Furthermore, due at least in part to the nature of the calculation being performed, some paths of the architecture may produce "bottlenecks," resulting in potential circuit delay.

Figure 6:
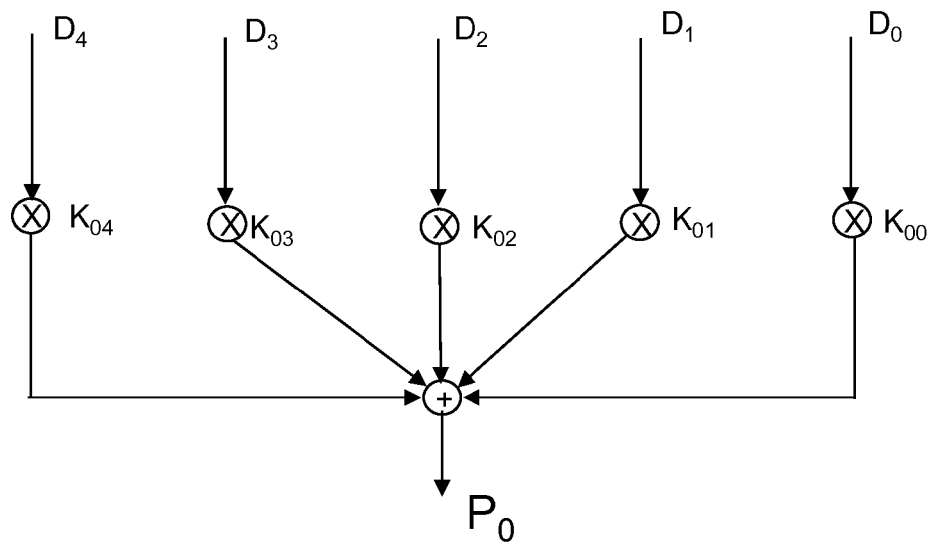
Figure 6:
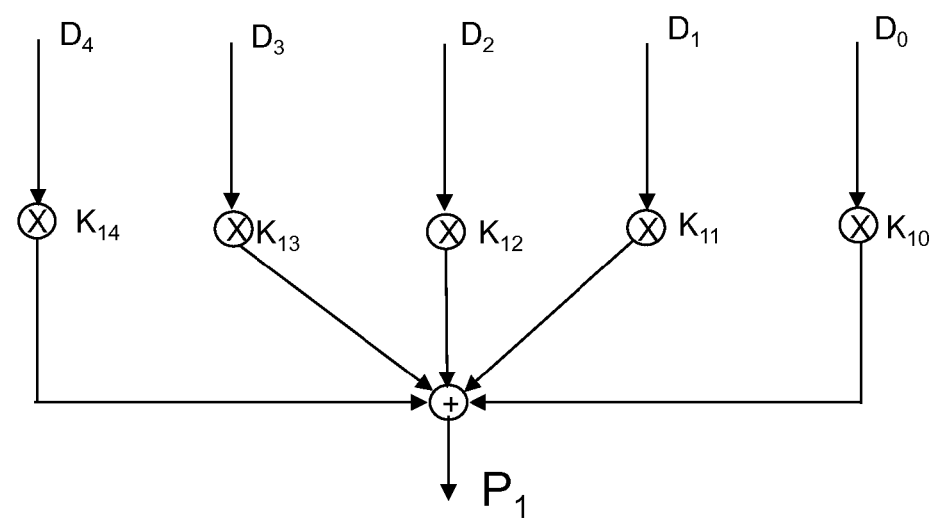
Figure 6:
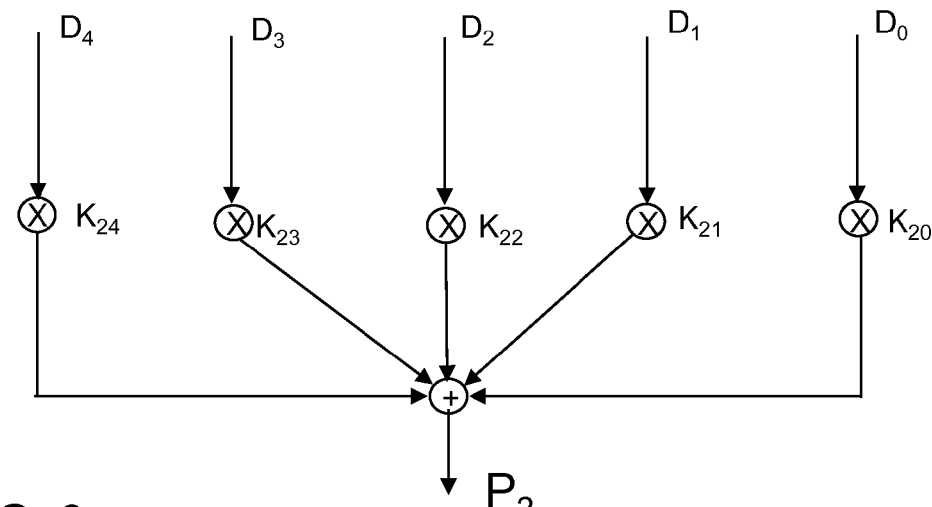

FIG. 6 illustrates an embodiment 600 of a circuit architecture that may reduce circuit delay and/or circuit complexity compared with embodiments 400 and 500, for example. As illustrated, embodiment 600 may comprise a circuit architecture having smaller complexity for a given type of error code, as well as a relatively high throughput and/or relatively low latency. Parity data may be generated by a sum of products having a combinational logic structure of embodiment 600. Program data $D_4, D_3, \ldots, D_0$, continuing with the previous example, are provided and coefficients, such as canonical coefficients, for example, may be employed. A sum of products, as illustrated for an embodiment, may therefore compute parity data. Embodiment 600 may involve a Reed Solomon or a narrow-sense BCH parity calculation, for example. In a narrow-sense BCH calculation, a symbol may comprise a single bit in size. Multiplication and addition operations may comprise binary calculations (e.g., from GF(2)). In a Reed Solomon configuration, calculations may be realized with symbols of size q (e.g., q>3) with multiplication and addition operations performed over a finite field $GF(2^q)$. Of course, embodiment 600 is merely an example, and claimed subject matter is not limited to this particular architecture.

Figure 7:
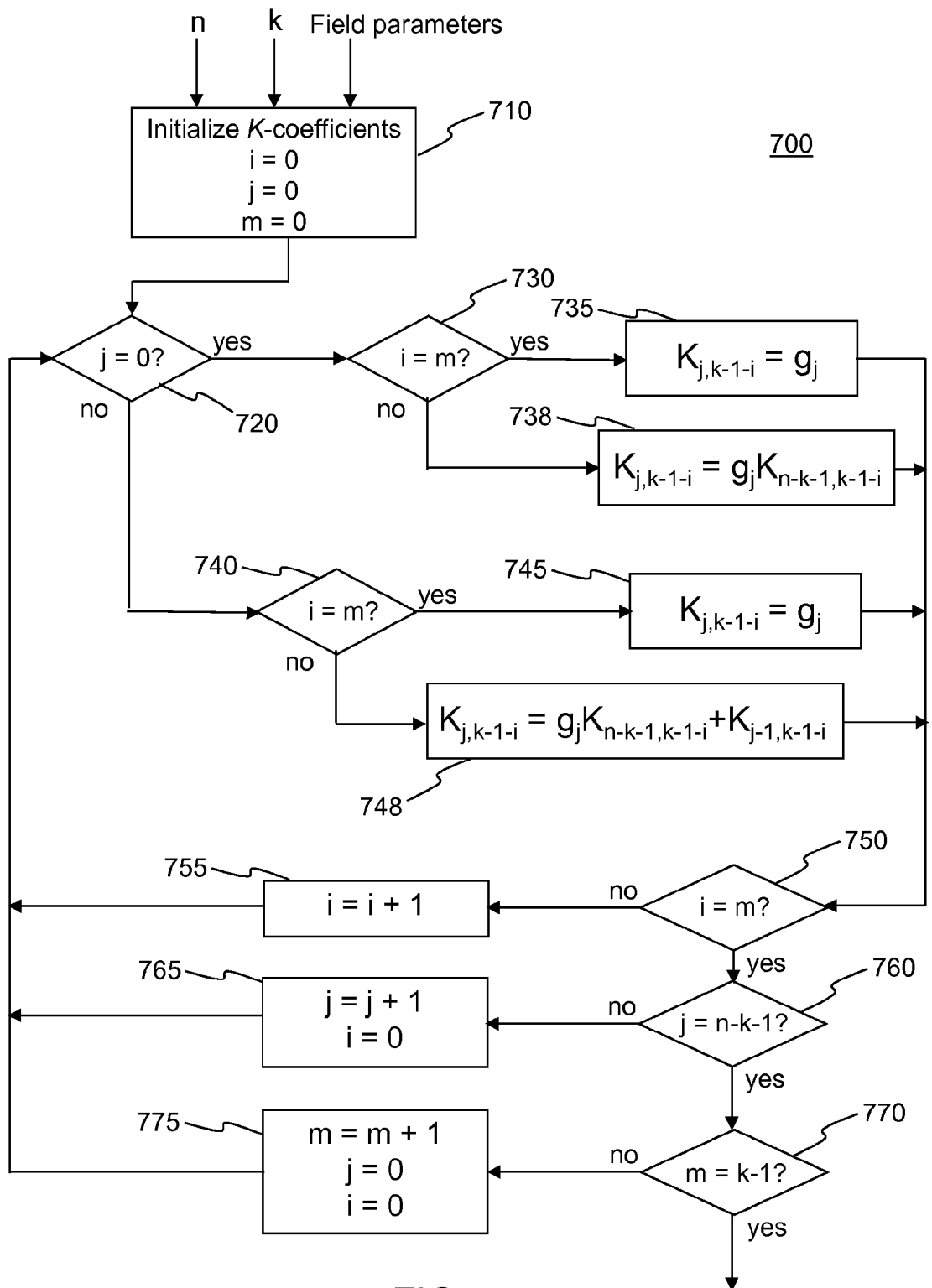
FIG. 7 is a flow diagram of an embodiment of a process to compute coefficient data representing K coefficients.

FIG. 7 is a flow diagram of an embodiment of a process 700 to compute (e.g., generate) coefficient data representing canonical coefficients. As explained above, canonical coefficients may be used to compute parity data, such as illustrated by embodiment 600, for example. Though process 700 may involve an iterative process, process 700 need not involve program data. Coefficients, therefore, may be computed independently of program data to provide canonical coefficients. At block 710, initialization of process 700 may include initializing parameters such as n and/or k. For example, n may comprise 8 and k may comprise 5. Field parameters may comprise parameters for use in arithmetic operations. For example, multiplication tables may be stored to perform arithmetic in a finite field of interest. At block 710, i, j, and m may be set to zero. These parameters may operate as index values. For example, with k=5, possible values of i may comprise 0 through 4. In this example, j may comprise from 0 to one less than the number of roots of a generator polynomial, e.g., 0 . . . (n−k−1). In this example, m may index program data (k), so possible values for m may include values in the range 0 . . . (k−1).

At block 720, a determination may be made as to whether j is equal to zero. If so, process 700 may proceed to block 730 for a "yes" result or to block 740 for a "no" result. At block 730, a determination may be made as to whether i is equal to m. Consequently, a canonical coefficient may be assigned a value according to block 735 if "yes" and according to block 738 if "no." At block 740, a determination may be made as to whether i is equal to m. Consequently, a canonical coefficient may be assigned a value according to block 745 if "yes" and according to block 748 if "no." Thus, as a result of appropriate decision paths being resolved, coefficients may be calculated. In one particular implementation, canonical coefficients may be determined at blocks 735, 738, 745, and 748 according to relations 11a,b, for example, presented below. Of course, this is merely one example, and coefficient data may likewise be computed using other techniques and/or approaches.

After a calculation iteration, parameter indexes may be employed to continue to resolve appropriate decision paths. At block 750, if values of i and m are equal, an iteration of m has taken place. If so, process 700 may proceed to block 760. Otherwise, process 700 may proceed to block 755 where i may be incremented. At block 760, a determination may be made as to whether to proceed with another iteration of j by evaluating whether j is equal to n−k−1. If so, process 700 may proceed to block 770. Otherwise, process 700 may proceed to block 765 where j may be incremented and i may be assigned a zero value. At block 770, a determination may be made as to whether to proceed with another iteration of m by evaluating whether m is equal to (k−1). Equality between the values of m and (k−1) may indicate that a set of canonical coefficients have been calculated. This may mark an end point and exit from process 700 may take place. However, if m is still less than (k−1), process 700 may proceed to block 775 for another iteration, where values i, j, and m may be updated by resetting i and j to zero and incrementing a value of m. Process 700 may then return to block 720 for iteration.

A calculation of canonical coefficients is provided below for a specific example. Although claimed subject matter is not limited in scope to this example, an example calculation may be useful to demonstrate application of calculations illustrated by blocks 735, 738, 745 and 748.

A circuit architecture illustrated by embodiment 400 may likewise be useful in connection with an example calculation. For example, labels $g_0$, $g_1$, $g_2$ may correspond to coefficients of a generator polynomial, for example. A feedback portion may therefore result in multiplication of a feedback signal, illustrated by circuit paths 440 and multiplier 425. Interim values $P_0^{(m)}$, $P_1^{(m)}$ and $P_2^{(m)}$ may be calculated on successive iterations and stored in registers 430. For example, five bits of program data may produce five iterations in this example calculation. Prior to beginning an encoding sequence, registers 430 may be cleared to zero.

Introducing program data bit $D_4$ at 410, registers 430 may be updated in accordance with the relations below.

$$P_0^{(0)} = g_0 D_4 \tag{6a}$$

$$K_{04}^{(0)} = g_0 \tag{6b}$$

$$P_1^{(0)} = g_1 D_4 \tag{6c}$$

$$K_{14}^{(0)} = g_1 \tag{6d}$$

$$P_2^{(0)} = g_2 D_4 \tag{6e}$$

$$K_{24}^{(0)} = g_2 \tag{6f}$$

$$f_1 = K_{24}^{(0)} + D_3 \tag{6g}$$

For example, 6a, 6c, and 6e may represent register data after iteration 0. A $0^{th}$ iteration state may comprise a product of program data bit $D_4$ multiplied by a respective generator polynomial coefficient. Relations 6b, 6d, and 6f therefore may comprise values of $K_{j,k-1-i}^{(m)}|_{i=0 \ldots m-1}$ at a $0^{th}$ iteration. A feedback value may be given by relation 6g.

Likewise, 7a, 7d, and 7g may represent register data after iteration 1. 7b, 7c, 7e, 7f, 7h, and 7i may comprise $K_{j,k-1-i}^{(m)}|_{i=0 \ldots m-1}$ after iteration 1. Relation 7j may comprise a feedback value to be applied for the next iteration, for example.

$$P_0^1 = g_0 f_1 = g_0 K_{24}^{(0)} D_4 + g_0 D_3 \tag{7a}$$

$$K_{04}^{(1)} = g_0 K_{24}^{(0)} \tag{7b}$$

$$K_{03}^{(1)} = g_0 \tag{7c}$$

$$P_1^{(1)} = g_1 f_1 + K_{04}^{(0)} D_4 = [g_1 K_{24}^{(0)} + K_{04}^{(0)}] D_4 + g_1 D_3 \tag{7d}$$

$$K_{14}^{(1)} = g_1 K_{24}^{(0)} + K_{04}^{(0)}, \tag{7e}$$

$$K_{13}^{(1)} = g_1 \tag{7f}$$

$$P_2^{(1)} = g_2 f_1 + K_{14}^{(0)} D_4 = [g_2 K_{24}^{(0)} + K_{14}^{(0)}] D_4 + g_2 D_3 \tag{7g}$$

$$K_{24}^{(1)} = g_2 K_{24}^{(0)} + K_{14}^{(0)}, \tag{7h}$$

$$K_{23}^{(1)} = g_2 \tag{7i}$$

$$f_2 = K_{24}^{(1)} D_4 + K_{23}^{(1)} D_3 + D_2 \tag{7j}$$

Below are values for iteration 2.

$$P_0^{(2)} = g_0 f_2 = g_0 K_{24}^{(1)} D_4 + g_0 K_{23}^{(1)} D_3 + g_0 D_2 \tag{8a}$$

$$K_{04}^{(2)} = g_0 K_{24}^{(1)} \tag{8b}$$

$$K_{03}^{(2)} = g_0 K_{23}^{(1)} \tag{8c}$$

$$K_{02}^{(2)} = g_0 \tag{8d}$$

$$\begin{aligned} P_1^{(2)} &= g_1 f_2 + K_{04}^{(1)} D_4 + K_{03}^{(1)} D_3 \\ &= g_1 [K_{24}^{(1)} D_4 + K_{23}^{(1)} D_3 + D_2] + K_{04}^{(1)} D_4 + K_{03}^{(1)} D_3 \\ &= [g_1 K_{24}^{(1)} + K_{04}^{(1)}] D_4 + [g_1 K_{23}^{(1)} + K_{03}^{(1)}] D_3 + g_1 D_2 \end{aligned} \tag{8e}$$

$$K_{14}^{(2)} = g_1 K_{24}^{(1)} + K_{04}^{(1)}, \tag{8f}$$

$$K_{13}^{(2)} = g_1 K_{23}^{(1)} + K_{03}^{(1)}, \tag{8g}$$

$$K_{12}^{(2)} = g_1 \tag{8h}$$

-continued $$P_2^{(2)} = g_2 f_2 + K_{14}^{(1)} D_4 + K_{13}^{(1)} D_3 = g_2 [K_{24}^{(1)} D_4 + K_{23}^{(1)} D_3 + D_2] + K_{14}^{(1)} D_4 + K_{13}^{(1)} D_3$$ [8i]

$$K_{24}^{(2)} = [g_2 K_{24}^{(1)} + K_{14}^{(1)}],$$ [8j]

$$K_{23}^{(2)} = [g_2 K_{23}^{(1)} + K_{13}^{(1)}],$$ [8k]

$$K_{22}^{(2)} = g_2$$ [8l]

$$f_3 = K_{24}^{(2)} D_4 + K_{23}^{(2)} D_3 + K_{22}^{(2)} D_2 + D_1$$ [8m]

Below are values for iteration 3.

$$P_0^{(3)} = g_0 f_3 = g_0 K_{24}^{(2)} D_4 + g_0 K_{23}^{(2)} D_3 + g_0 K_{22}^{(2)} D_2 + g_0 D_1$$ [9a]

$$K_{04}^{(3)} = g_0 K_{24}^{(2)},$$ [9b]

$$K_{03}^{(3)} = g_0 K_{23}^{(2)},$$ [9c]

$$K_{02}^{(3)} = g_0 K_{22}^{(2)},$$ [9d]

$$K_{01}^{(3)} = g_0$$ [9e]

$$P_1^{(3)} = g_1 f_3 + K_{04}^{(2)} D_4 + K_{03}^{(2)} D_3 + K_{02}^{(2)} D_2$$
$$= g_1 [K_{24}^{(2)} D_4 + K_{23}^{(2)} D_3 + K_{22}^{(2)} D_2 + D_1] + K_{04}^{(2)} D_4 + K_{03}^{(2)} D_3 + K_{02}^{(2)} D_2$$
$$= [g_1 K_{24}^{(2)} + K_{04}^{(2)}] D_4 + [g_1 K_{23}^{(2)} + K_{03}^{(2)}] + [g_1 K_{22}^{(2)} + K_{02}^{(2)}] D_2 + g_1 D_1$$ [9f]

$$K_{14}^{(3)} = g_1 K_{24}^{(2)} + K_{04}^{(2)},$$ [9g]

$$K_{13}^{(3)} = g_1 K_{23}^{(2)} + K_{03}^{(2)},$$ [9h]

$$K_{12}^{(3)} = g_1 K_{22}^{(2)} + K_{02}^{(2)},$$ [9i]

$$K_{11}^{(3)} = g_1$$ [9j]

$$P_2^{(3)} = g_2 f_3 + P_1^{(2)}$$
$$= [g_2 K_{24}^{(2)} + K_{14}^{(2)}] D_4 + [g_2 K_{23}^{(2)} + K_{13}^{(2)}] D_3 + [g_2 K_{22}^{(2)} + K_{12}^{(2)}] D_2 + g_2 D_1$$ [9k]

$$K_{24}^{(3)} = g_2 K_{24}^{(2)} + K_{14}^{(2)},$$ [9l]

$$K_{23}^{(3)} = g_2 K_{23}^{(2)} + K_{13}^{(2)},$$ [9m]

$$K_{22}^{(3)} = g_2 K_{22}^{(2)} + K_{12}^{(2)},$$ [9n]

$$K_{21}^{(1)} = g_2$$ [9o]

$$f_4 = K_{24}^{(3)} D_4 + K_{23}^{(3)} D_3 + K_{22}^{(3)} D_2 + K_{21}^{(3)} D_1 + D_0$$ [9p]

In the example, results of iteration 4, provided below, may comprise a final iteration. Accordingly, 10a, 10h, and 10n may represent values of parity data calculated for an example case of n=8 and k=3.

$$P_0^{(4)} = g_0 f_4 = g_0 K_{24}^{(3)} D_4 + g_0 K_{23}^{(3)} D_3 + g_0 K_{22}^{(3)} D_2 + g_0 K_{21}^{(3)} D_1 + g_0 D_0$$ [10a]

$$K_{04}^{(4)} = g_0 K_{24}^{(3)},$$ [10b]

$$K_{03}^{(3)} = g_0 K_{23}^{(3)},$$ [10c]

$$K_{02}^{(3)} = g_0 K_{22}^{(3)},$$ [10d]

$$K_{01}^{(3)} = g_0 K_{21}^{(3)},$$ [10e]

$$K_{00}^{(4)} = g_0$$ [10f]

$$P_1^{(4)} = g_1 f_4 + K_{04}^{(3)} D_4 + K_{03}^{(3)} D_3 + K_{02}^{(2)} D_2 + K_{01}^{(2)} D_1 =$$
$$[g_1 K_{24}^{(3)} + K_{04}^{(3)}] D_4 + [g_1 K_{23}^{(3)} + K_{03}^{(3)}] D_3 + [g_1 K_{22}^{(3)} + K_{02}^{(3)}] D_2 + [g_1 K_{21}^{(3)} + K_{01}^{(3)}] D_1 + g_1 D_0$$ [10h]

$$K_{14}^{(4)} = g_1 K_{24}^{(3)} + K_{04}^{(3)},$$ [10i]

$$K_{13}^{(4)} = g_1 K_{23}^{(3)} + K_{03}^{(3)},$$ [10j]

$$K_{12}^{(4)} = g_1 K_{22}^{(3)} + K_{02}^{(3)},$$ [10k]

$$K_{11}^{(4)} = g_1 K_{21}^{(3)} + K_{01}^{(3)},$$ [10l]

$$K_{10}^{(4)} = g_1$$ [10m]

$$P_2^{(4)} = g_2 f_4 + P_1^{(3)} = [g_2 K_{24}^{(3)} + K_{14}^{(3)}] D_4 + [g_2 K_{23}^{(3)} + K_{13}^{(3)}] D_3 + [g_2 K_{22}^{(3)} + K_{12}^{(3)}] D_2 + [g_2 K_{21}^{(3)} + K_{11}^{(3)}] D_1 + g_2 D_0$$ [10n]

$$K_{24}^{(4)} = g_2 K_{24}^{(3)} + K_{14}^{(3)},$$ [10o]

$$K_{23}^{(4)} = g_2 K_{23}^{(3)} + K_{13}^{(3)},$$ [10p]

$$K_{22}^{(4)} = g_2 K_{22}^{(3)} + K_{12}^{(3)},$$ [10q]

$$K_{21}^{(4)} = g_2 K_{21}^{(3)} + K_{11}^{(3)},$$ [10r]

$$K_{20}^{(4)} = g_2$$ [10s]

From the example calculation and induction, a generalized form for canonical coefficients may be represented by 11a. Relation 11a may represent cases with j>0.

$$K_{j,k-1-i}^{(m)} = g_j K_{j,k-1-i}^{(m-1)} + K_{j-1,k-1-i}^{(m-1)}$$ [11a]

In cases with j=0, relation 11b may be employed.

$$K_{j,k-1-i}^{(m)} = g_j K_{j,k-1-i}^{(m-1)}$$ [11b]

Thus, for embodiment 700, for example, previously discussed, values for canonical coefficients using 11a and/or 11b may be calculated.

Figure 8:
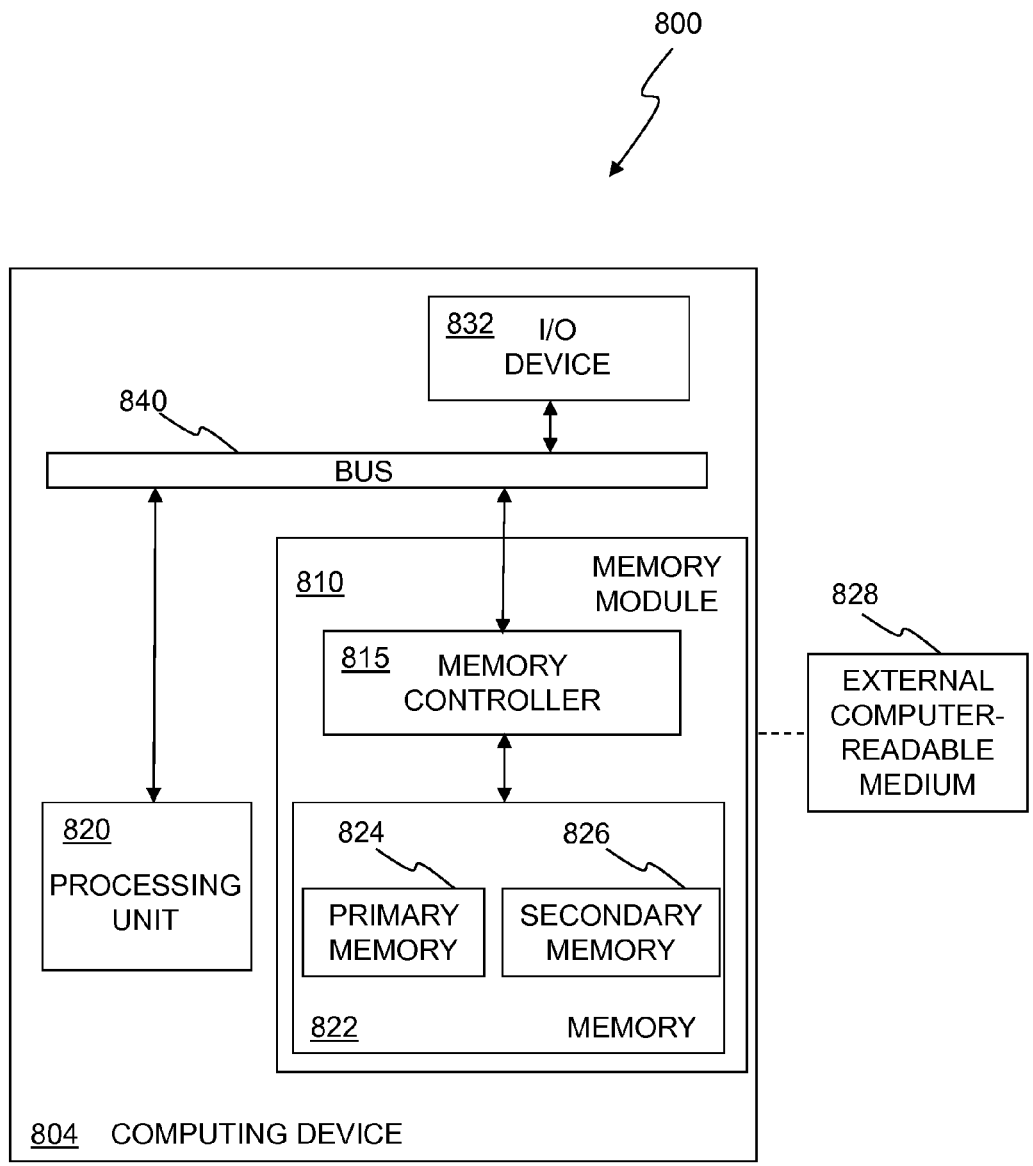
FIG. 8 is a schematic diagram illustrating an embodiment of a computing system.

FIG. 8 is a schematic diagram illustrating an embodiment of an apparatus in the form of a computing system 800 including a memory device in the form of a memory module 810 (wherein the memory device itself could be considered an apparatus), for example. A computing device may comprise one or more processors, for example, to execute an application and/or other code. A computing device 804 may be representative of any device, appliance, and/or machine that may be used to operatively access memory module 810. Memory module 810 may include a memory controller 815 and a memory 822. By way of example, but not limitation, computing device 804 may include: one or more computing devices or platforms, such as, e.g., a tablet computer, a desktop computer, a laptop computer, a workstation, a server device, and/or the like; one or more personal computing and/or communication devices and/or appliances, such as, e.g., a personal digital assistant, mobile communication device, and/or the like; a computing system, such as, e.g., a database, and/or other system; and/or any combination thereof.

It is recognized that all and/or part of the various devices shown in system 800, and/or methods, such as those as further described herein, may be implemented using and/or otherwise including at least one of hardware, firmware, and/or software, other than software by itself. Thus, by way of example, but not limitation, computing device 804 may include one or more processing units 820 operatively coupled to memory 822, such as through a bus 840 and memory controller 815. Processing unit 820 is representative of one or more devices capable of performing a portion of a computing procedure or process. By way of example, but not limitation, processing unit 820 may include one or more processors, microprocessors, controllers, application specific integrated circuits, digital signal processors, programmable logic devices, field programmable gate arrays, the like, and/or any combination thereof. Processing unit 820 may include an operating system to be executed that is capable of communication with memory controller 815. An operating system may, for example, generate commands to be sent to memory controller 815 over and/or via bus 840. Commands may comprise read and/or write commands, for example. In response to a write command, for example, memory controller 815 may perform process 800 described above, to program memory and/or to compute parity data.

Memory 822 may include, for example, a primary memory 824 and/or a secondary memory 826. Primary memory 824 may include, for example, a random access memory, read only memory, etc. While memory may be illustrated as being separate from another device, such as processing unit 820, it should be understood that all and/or part of memory, such as primary memory 824, for example may be provided within and/or otherwise coupled with processing unit 820. In one implementation, memory 822 may be incorporated in an integrated circuit, for example, which may comprise a port to receive error syndromes and/or other ECC data from processing unit 820.

Secondary memory 826 may include, for example, the same and/or similar type of memory as primary memory and/or one or more other types of memories, such as a disk drive, an optical disc drive, a tape drive, a solid state memory drive, etc. In certain implementations, secondary memory 826 may, for example, comprise a storage medium that may include a computer-readable or may be operatively receptive of, and/or otherwise capable of being operatively coupled to an external memory, such as an external computer-readable medium, such as 828. Computer-readable medium 828 may include, for example, any medium that is able to store, carry, and/or make accessible readable, writable, and/or rewritable code, instructions, or any other information for one or more of the devices in system 800. Computing device 804 may include, for example, an input/output device, such as unit 832.

In the preceding description, various aspects of claimed subject matter have been described. For purposes of explanation, specific numbers, systems, and/or configurations may have been set forth to provide a thorough understanding of claimed subject matter. However, it should be apparent to one skilled in the art having the benefit of this disclosure that claimed subject matter may be practiced without those specific details. In other instances, features that would be understood by one of ordinary skill were omitted and/or simplified so as not to obscure claimed subject matter. While certain features have been illustrated and/or described herein, many modifications, substitutions, changes, and/or equivalents may now occur to those skilled in the art. It is, therefore, to be understood that the appended claims are intended to cover all such modifications and/or changes as fall within the purview of claimed subject matter.

The invention claimed is:

1. An electronically-implemented method of protecting program data, the method comprising:
   retrieving predetermined coefficient data from an external device for computation of an error protection code, the predetermined coefficient data representing canonical coefficients that are determined independent of program data and are employed to compute parity data from program data;
   combining the predetermined coefficient data and the program data to compute an error protection code comprising parity data, wherein the parity data comprises a sum of products, wherein the products comprise the predetermined coefficient data multiplied by the program data; and
   storing the program data with the error protection code in memory.

2. The method of claim 1, further comprising computing or retrieving the predetermined coefficient data responsive to a selection of the error protection code.

3. The method of claim 2, wherein computing or retrieving responsive to the selection of the error protection code comprises computing responsive to the selection of the error protection code by a user.

4. The method of claim 1, further comprising using the stored program data and the stored parity data to correct one or more errors in the stored program data.

5. The method of claim 1, further comprising computing the parity data in parallel.

6. The method of claim 1, further comprising using the predetermined coefficient data to compute respective parity data for different sets of program data stored in different memory arrays.

7. The method of claim 1, wherein the predetermined coefficient data is stored in a look-up table.

8. The method of claim 1, wherein the error protection code comprises a generalized block oriented algebraic error protection code.

9. The method of claim 8, wherein the generalized block oriented algebraic error protection code comprises a Bose, Chaudhuri, Hocquenghem (BCH) code or a Reed-Solomon code.

10. The method of claim 1, wherein the predetermined coefficient data are based, at least in part, on a generator polynomial.

11. An apparatus comprising:
    circuitry configured to compute parity data based, at least in part, on program data and on predetermined coefficient data, wherein the parity data comprises a sum of products, wherein the products comprise the predetermined coefficient data multiplied by the program data, wherein the predetermined coefficient data represent canonical coefficients that are determined independent of the program data, are employed to compute the parity data from the program data, and are received from an external device; and
    a memory array configured to store the parity data with the program data.

12. The apparatus of claim 11, wherein the circuitry comprises circuitry configured to compute the parity data in parallel.

13. The apparatus of claim 11, wherein the circuitry includes an encoder.

14. The apparatus of claim 11, wherein the predetermined coefficient data is stored in a look-up table included in the circuitry.

15. The apparatus of claim 11, wherein the predetermined coefficient data comprises coefficient data computed external to the apparatus.

16. The apparatus of claim 11, wherein the circuitry comprises combinational logic circuitry.

17. The apparatus of claim 11, wherein the error protection code comprises a selectable error protection code.

18. The apparatus of claim 17, wherein the selectable error protection code comprises a Bose, Chaudhuri, Hocquenghem (BCH) code or a Reed-Solomon code.

19. An apparatus comprising:

parity computing circuit blocks configured to compute associated parity data for corresponding groups of program data, the circuit blocks configured to apply predetermined coefficients to one or more groups of program data, wherein the predetermined coefficients represent canonical coefficients that are determined independent of the program data, are employed to compute the parity data from the program data, and are received from an external device, wherein the parity data comprises a sum of products, wherein the products comprise the predetermined coefficient data multiplied by the program data; and a memory array configured to store the parity data with the program data.

20. The apparatus of claim 19, wherein the parity computing circuit blocks are configured to operate in parallel.

* * * * *